(12) United States Patent
Myers (10) Patent No.: US 12,047,091 B2
(45) Date of Patent: Jul. 23, 2024

(54) APPARATUS AND SYSTEM FOR A PROGRAMMABLE RESISTANCE CIRCUIT

(71) Applicant: Joyson Safety Systems Acquisition LLC, Auburn Hills, MI (US)

(72) Inventor: Kenneth T. Myers, Clarkston, MI (US)

(73) Assignee: Joyson Safety Systems Acquisition LLC, Auburn Hills, MI (US)

( * ) Notice: Subject to any disclaimer, the term of this patent is extended or adjusted under 35 U.S.C. 154(b) by 0 days.

(21) Appl. No.: 18/214,139

(22) Filed: Jun. 26, 2023

(65) Prior Publication Data
US 2023/0421169 A1    Dec. 28, 2023

Related U.S. Application Data

(63) Continuation of application No. 17/338,635, filed on Jun. 3, 2021, now Pat. No. 11,705,922.

(60) Provisional application No. 63/034,362, filed on Jun. 3, 2020.

(51) Int. Cl.
| H03M 1/78 | (2006.01) |
| B60K 35/00 | (2024.01) |
| H03K 5/08 | (2006.01) |
| H03K 17/74 | (2006.01) |

(52) U.S. Cl.
CPC .............. *H03M 1/785* (2013.01); *B60K 35/00* (2013.01); *H03K 5/08* (2013.01); *H03K 17/74* (2013.01); *H03M 1/78* (2013.01)

(58) Field of Classification Search
CPC .......... B60K 35/00; H03K 17/74; H03K 5/08; H03M 1/78; H03M 1/785; G06F 2203/04104
See application file for complete search history.

(56) References Cited

U.S. PATENT DOCUMENTS

| 5,969,561 | A | 10/1999 | McGillan |
| 9,898,087 | B2 | 2/2018 | Lisseman et al. |
| 10,007,342 | B2 | 6/2018 | Lisseman et al. |
| 10,114,513 | B2 | 10/2018 | Staszak et al. |
| 10,124,823 | B2 | 11/2018 | Van'tZelfde et al. |
| 10,336,361 | B2 | 7/2019 | Olson et al. |
| 11,001,167 | B2 | 5/2021 | Wilson |
| 2019/0080230 | A1* | 3/2019 | Hatcher ............... G06F 7/5443 |
| 2019/0204920 | A1 | 7/2019 | Lisseman et al. |

* cited by examiner

*Primary Examiner* — Robin J Mishler
(74) *Attorney, Agent, or Firm* — Meunier Carlin & Curfman LLC (57) ABSTRACT

A programmable resistance circuit provides a selected resistance by configuring a reference resistor to exhibit an effective resistance, in an operational sense, by achieving an average output voltage between a source line and a return line in the programmable resistance circuit. The average output voltage corresponds to the effective resistance. The effective resistance is achieved by utilizing a modulated voltage source to bias a transistor and intermittently draw current across the reference resistor according to the duty cycle of the modulated voltage source. A programmed resistance circuit can produce a selected resistance corresponding to button selection zones of a vehicle user interface when connected to a remote circuit that acts according to a user selection.

20 Claims, 4 Drawing Sheets

APPARATUS AND SYSTEM FOR A PROGRAMMABLE RESISTANCE CIRCUIT

CROSS REFERENCE TO RELATED APPLICATIONS

This application claims priority to and incorporates entirely by reference U.S. patent application Ser. No. 17/338,635 filed on Jun. 3, 2021, now U.S. Pat. No. 11,705,922, and further claims priority to and incorporates by reference U.S. Provisional Patent Application Ser. No. 63/034,362 filed on Jun. 3, 2020, and entitled Apparatus and System for a Programmable Resistance Circuit.

FIELD OF THE DISCLOSURE

This disclosure relates to electronic circuits that enable vehicle drivers and passengers to communicate with a vehicle control system without using traditional switching systems, and this disclosure provides an apparatus to configure equivalent user selection data with better use of fewer circuit components.

BACKGROUND

Earlier technologies have provided traditional buttons and prior art switching systems to transmit user selection data to a vehicle controller. Many of these systems previously had a direct connection for each button to a corresponding switching mechanism that communicated with an electronic control unit. In automotive switches such as those provided in steering wheels, mechanical switches have been the dominant technology. These are constructed of either silicone rubber domes or metal domes. These switches provide two states, open circuit or closed circuit.

Figure 1:
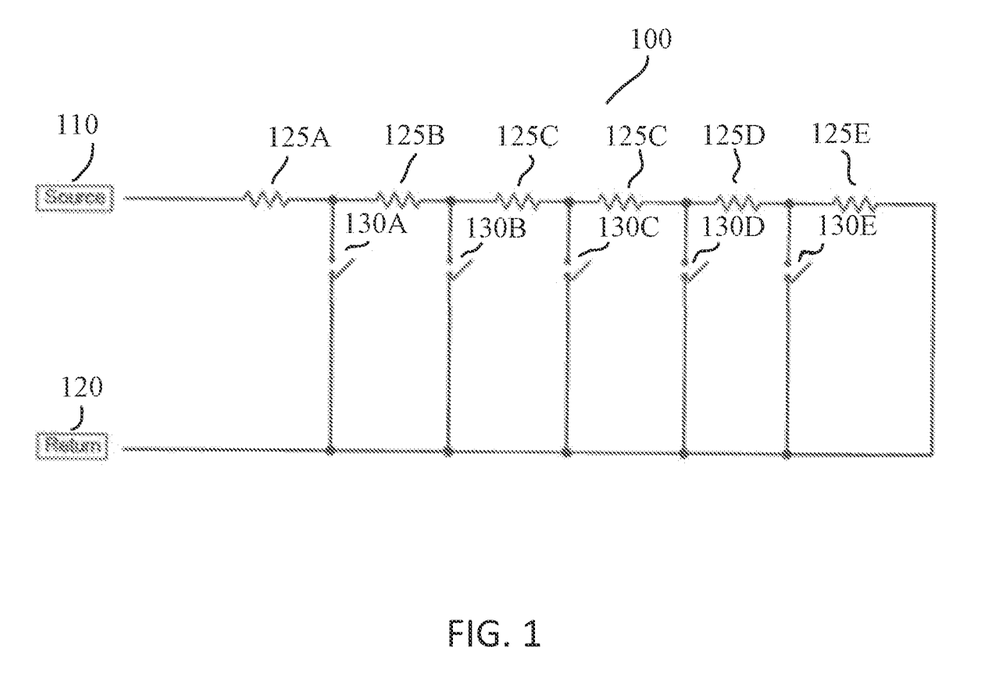
FIG. 1 is a plan view of a resistive ladder used as an example environment for this disclosure.

As vehicles have become more sophisticated, the hardware needed to provide smart vehicle communications systems has required design updates in regard to speed, functionality, and space requirements. For example, commonly used traditional switches are grouped with five or more switches on each side of the steering wheel. These switches are typically connected using a resistive ladder, such that each switch provides a unique resistance value. These are typically read by the Body Control Module (BCM) using a pull up resistor and an analog to digital converter (ADC). In order to interface and read the state of the switches, there are several design considerations. First, the design must minimize the number of wires in the harness (and pins on the reading device). A resistive ladder requires only two lines to interface and read all the attached switches. Second, the switch detection needs to be immune to ground voltage offset. In automotive systems, different modules may have different potentials on their circuit return ground, referred to herein as a remote ground (as compared to a local ground of the programmed resistance circuit described below). FIG. 1 shows the most commonly used solution in a typical resistive ladder 100.

Figure 2:
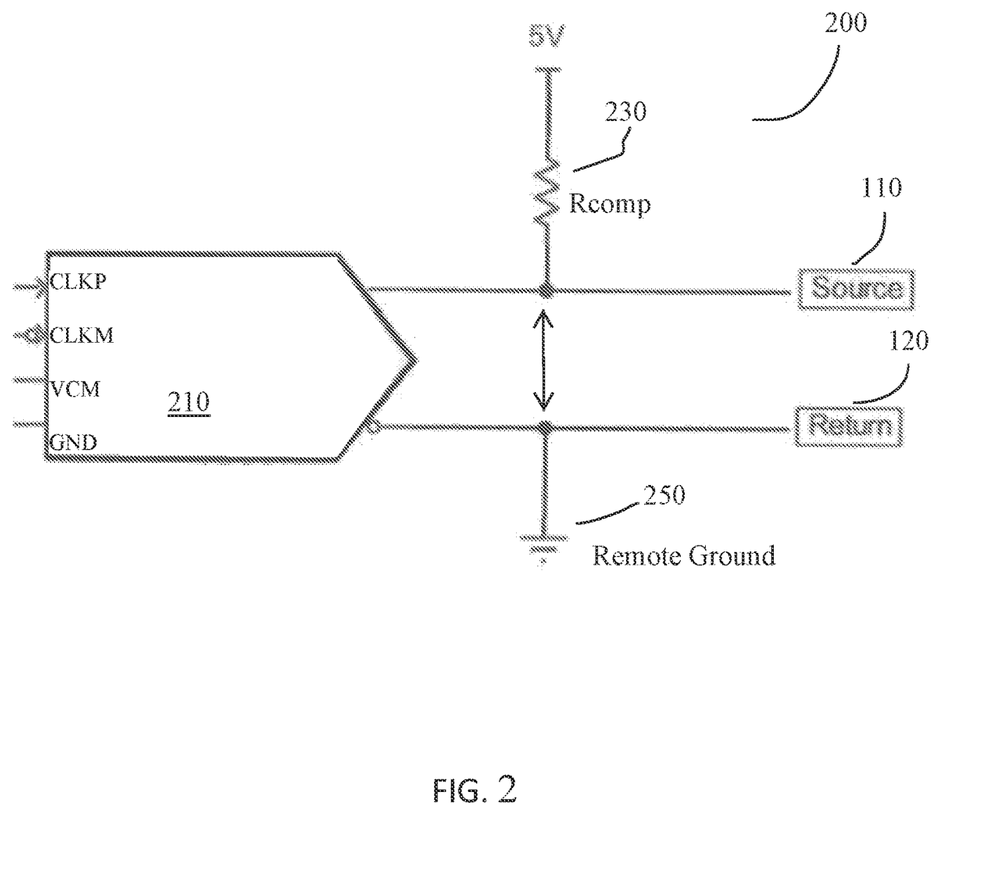
FIG. 2 is a plan view of a reading circuit that can be used to assess data from a user interface and may be used as a reader for the resistive ladder of FIG. 1.

The resistive ladder of FIG. 1 illustrates that, with no switches 130A-130E closed, the resistance between Source 110 and Return 120 is the total of the resistance across the whole ladder 100. As any one of switches 130A-130E is pressed, the resistance returned is the total resistance up to that switch from source to return. This circuit 100 provides ground offset immunity by keeping the return line 120 isolated from the remote ground of the external electronic control modules. Typically, the reading circuit will have a pull up resistor to a reference voltage connected to the source and also an analog to digital converter (ADC) 210, as shown in FIG. 2.

As more advanced technologies, such as capacitive or resistive touch screens or force-based switching, are employed, the user selection is determined by an X/Y position and is interpreted by a microcontroller 200. The issue becomes how to communicate the detected switch actuation to other modules in a manner that is compatible with those systems. A typical structure would include an LIN or CAN bus, but these can impose system communication latency or unwanted cost. A resistive ladder with electronically actuated switches could be provided but relays are expensive and require a relatively large board space. Opto-isolators could be used, but automotive qualified parts are expensive and also take up a lot of board space. MOSFETs could be used, but system cost could be prohibitive and require a number of MCU I/O pins.

A need exists in the art of microelectronics, particularly for associated vehicle systems, for a circuit that can provide a selected resistance from a circuit having an isolated local ground, and the circuit must still interact with remote electronic modules having remote grounds without a voltage offset problem between the local and remote grounds.

BRIEF SUMMARY

The details of one or more implementations of the disclosure are set forth in the accompanying drawings and the description below. Other features, objects, and advantages of the disclosure will be apparent from the description and drawings, and from the claims.

In one implementation, a programmable resistance circuit configures a reference resistor to exhibit a plurality of resistance values and provide a respectively selected resistance value from a source connection relative to a return circuit connecting a return signal to at least one external electronic control module. The programmable resistance circuit includes a transistor configured for connecting to the reference resistor. One should note that the reference resistor may be part of a remote circuit and not the programmable resistance circuit (e.g., the reference resistor of a reading circuit connected to the resistive ladder of FIG. 1). The transistor is connected to an analog return line from the programmable resistance circuit, which in turn is connected to a remote ground to eliminate voltage offsets at local and remote grounds. A modulated voltage source is connected to a local ground and the transistor, wherein the modulated voltage source biases the transistor between a first state, allowing forward current flow in the programmable resistance circuit from the source line to the analog return line, and a second state exhibiting a high impedance to the forward current flow to the analog return line. The first state and the second state respectively emulate turning the reference resistor off and on to establish an average or selected resistance value sensed at a remote module, such as but not limited to, the reading module of a microcontroller connected to a sensor system such as a resistive ladder. The average selected resistance value is the result of establishing an average output voltage from the source line to the analog return line in the programmable resistance circuit. The analog return line ultimately connects to a remote ground of the at least one external electronic circuit module such that the analog return line is isolated from the local ground of the programmable resistance circuit.

BRIEF DESCRIPTION OF THE DRAWINGS

Various implementations of the system are explained in even greater detail in the following exemplary drawings.

The drawings are merely exemplary to illustrate the structure of the system and certain features that may be used singularly or in combination with other features. The disclosure should not be limited to the implementations shown.

DETAILED DESCRIPTION

Implementations described above in relation to FIGS. 1 through 4 may be used to activate button selection zones inside a vehicle. The button selection zones include, but are not limited to, areas on a vehicle user interface by which a user can control various operations in the vehicle with a touch or any other kind of user input that activates a function selection corresponding to the button selection zone. Typically, the button selection zones are labeled in a graphical user interface or another electromechanical interface that registers a user input and transmits appropriate function data to an external electronic control module, such as a vehicle body control module. The button selection zones are described as such because they replace traditional mechanical buttons and switches with touch sensitive regions inside the vehicle that are used to electronically control aspects of vehicle operation. Other interactions at the human-machine interface, such as voice sensitive button zones, are also within the scope of this disclosure. This disclosure incorporates by reference commonly owned U.S. patent application Ser. No. 16/220,751, published as U.S. patent publication number 2019/0204920 on Jul. 4, 2019, entitled Display Based Switch Assembly and Method of Use. This prior publication describes one example of related technologies for which this disclosure provides useful improvements.

In one implementation, a set of buttons or button zones are provided in a vehicle. The buttons or button zones may be connected to a computerized control system (i.e., a vehicle control system or vehicle accessory control system) and are accessible by a vehicle occupant. When the occupant selects one of the button zones via touch or even voice commands, that selection is received by a microcontroller 200 of the computerized control system via electrical signals, capacitive sensing, or force based sensing. Occupant selection circuits, automated command circuits, and touch sensing circuits of this disclosure may include but are not limited to those circuits of commonly owned U.S. Pat. Nos. 9,898,087 and 10,007,342 (force based touch interfaces) and U.S. Pat. Nos. 10,336,361; 10,124,823; 10,114,513; and 11,001,167 (capacitance based sensing and touch interfaces), all of which are incorporated by reference herein as if set forth in full in this disclosure. This disclosure includes use of numerous human-machine interfaces allowing a user to make a selection that is understood and utilized by a microcontroller 200 or other computers.

In regard to selection buttons and button zones in a vehicle, such as those positioned on a dashboard or steering wheel in the vehicle, each button zone may correspond to a particular function or series of functions controlled by software that is stored in computer readable memory. A particularly selected button zone may, therefore, implement a particular set of computer commands that operate portions of the vehicle control system or accessory control system. Each set of these computer commands, may therefore correspond to a respective external electronic control module, i.e., any computer controlled circuit, system or machine that performs a particular task in a vehicle. It is important, therefore, that the button selection zones, the various control systems, and the respective external electronic control modules be able to communicate over a network without interference while operating independently of one another. In some aspects, the independence of vehicle components relies upon electrical isolation from one another to avoid cross-talk, feedback, and other sources of noise on the respective circuits. Therefore, implementations of this disclosure provide for isolation among the grounding equipment used for sensing circuits, control system circuits, and corresponding computer driven systems in the vehicle.

Figure 3:
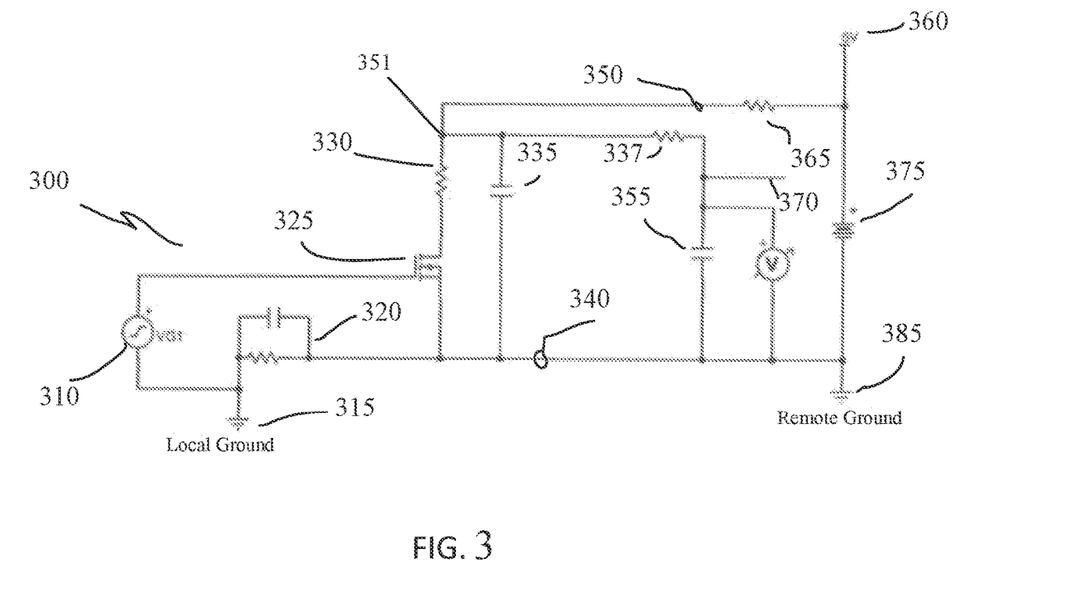
FIG. 3 is a plan view of a circuit diagram implementing a programmable resistance for use with user interface button selection zones described herein.

At a high level of generality and without limiting this disclosure, one aspect of the circuits and systems described herein is that of associating a particular, discrete resistance value, referred to as an effective resistance, sensed by reading circuits and/or external electronic control modules. The term "external electronic control module" is to be understood broadly and, without limiting this disclosure, refers to any electrical circuit, computer controlled machine or computerized system that receives control data from a computer, particularly a microcontroller 200 or CPU 206 in a vehicle, or from another connected electrical circuit. In one non-limiting sense, the external electronic control module has its own circuits and systems that detect changes in an effective resistance of a particular input circuit transmitting the control data. The resistive ladder of FIGS. 1 and 2 and the programmable resistance circuit of FIG. 3 are examples of particular input circuits that transmit control data in the form of changes in effective resistance across the particular input circuit to the external electronic control module.

The changes in effective resistance of the particular input circuit are, therefore, sensed by electronic modules (circuits, computerized systems, computer controlled machines) that are "external" to the particular input circuit exhibiting an effective resistance. An "external electronic control module" therefore may be considered, without limitation, any electrical circuit, computer controlled machine or computerized system that is external to a particular input circuit providing control data. In some example implementations, the particular input circuit of this disclosure may be a programmable resistance circuit 300 as shown in FIG. 3.

The reading circuits and/or external electronic control modules perform selected tasks and operations depending upon which effective resistance is sensed upon a user operating or selecting a button zone via the techniques described above (e.g., electric signals, force signals, or capacitance signals to name a few). It is important to ensure that a reading circuit or an external electronic control module senses a pre-programmed, expected, effective resistance value from a resistance circuit upon a particular selection of a button zone, and the programmable resistance circuit of FIG. 3 herein can provide that reliability in output. In this disclosure, therefore, each button zone in a vehicle may correspond to different effective resistance values from a particular input circuit as sensed by at least one external electronic control module.

Figure 4:
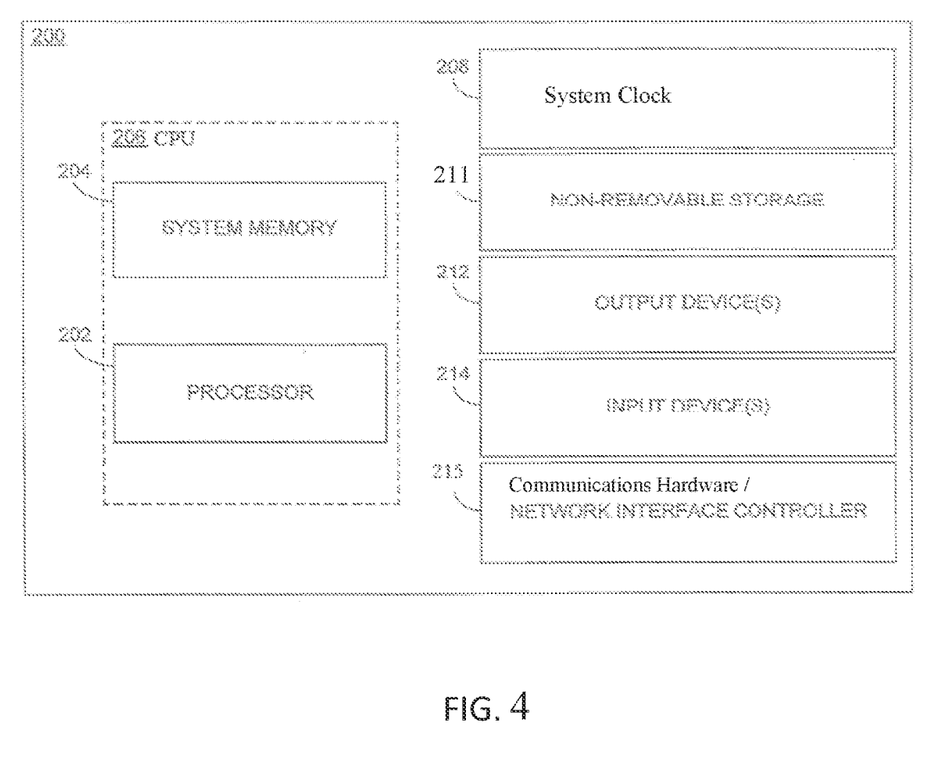
FIG. 4 is a plan view of an example computing environment that may implement the circuit of FIG. 3.

In modern vehicle design, at least one computer 200 may be used by numerous external systems to process control data and communicate with larger, overriding control mechanisms such as the above-referenced body control module (BCM). These computerized systems utilize the most up to date computing technology possible, and one example is shown in FIG. 4. In this disclosure, therefore, a microcontroller or other computing device 200 used to implement the technology disclosed herein may include a computer processing unit 206, a system clock 208, an output module 212 and communication hardware implemented as a network interface controller 215. In its most basic form, the computer processing unit (CPU) 206 may include a processor 202 and a system memory 204. The processor 202 may be a standard programmable processor that performs arithmetic and logic operations necessary for operation of the computing device 200. The processor 202 may be configured to execute program code encoded in tangible, computer-readable media. For example, the processor 202 may execute program code stored in the system memory 204, which may be volatile or non-volatile memory. The system memory 204 is only one example of tangible, computer-readable media. In one aspect, the computer processing unit 206 can be considered an integrated device such as firmware. Other examples of tangible, computer-readable media include, CD-ROMs, DVDs, hard drives, flash memory, or any other machine-readable storage media, wherein when the program code is loaded into and executed by a machine, such as the processor 202, the machine becomes an apparatus for practicing the disclosed subject matter.

Additionally, the processor 202 may be configured to associate the sensed changes in at least one electrical property of signals received from technology of this disclosure at a time from the system clock 208 and store the sensed changes and corresponding time to the system memory 204. Optionally, the processor 202 may be configured to analyze the stored data and associate measured changes to calculate a control message distributed by an output module 212 with various control messages for controlling system functions that may be selected by a vehicle user. The communication hardware 215 may further be configured for communicating the selected control message(s) from a user interface to an electronic control system over a communications bus. The processor 202, which is in communication with memory 204, executes computer-readable instructions stored on the memory 204.

One non-limiting issue that this disclosure addresses is that of ground voltage offset. For example, the above noted computing device 200 may be used to implement communications with a body control module (BCM) or another electronic controller and provide a vehicle driver or any vehicle occupant with mechanisms to transmit the vehicle occupant's selection from button selection zones provided in a vehicle user interface (i.e., a human machine interface). The vehicle systems, however, may have respective potentials on their circuit return lines relative to other modules also operating in the vehicle. In this sense, therefore, the modules may have offsets between respective grounds.

For example, and without limiting this disclosure, there are four methods of maintaining isolation between a local ground (as described herein) and a remote ground (such as that connected to another computer system, a microcontroller, or any other circuitry in use). The most common choices are optical isolation, electromagnetic (e.g., transformers) isolation, capacitors, and resistance. In one non-limiting implementation, this disclosure utilizes resistance to ensure the isolation. In one implementation, the resistance also allows turning on a MOSFET relative to the local ground domain and providing accuracy relative to the remote ground domain. This disclosure also eliminates some of the hardware that may have been previously necessary to implement desirable results.

In one implementation, this disclosure uses the concept of a resistive ladder 100 as an example of providing resistance isolation between a first circuit module implemented with a local ground and a remote module implemented with a remote ground, while maintaining accurate and interactive operation between the two modules. Taking the resistive ladder of FIG. 1 as a first example, the resistive ladder 100 is a circuit module requiring a local ground (not shown), and in FIG. 2, a microcontroller 200 implementing a reading circuit for the resistive ladder of FIG. 1 is a second module with a remote ground 250. The local ground of FIG. 1 must be isolated from the remote ground 250 of FIG. 2 for accuracy in the reading circuit.

This disclosure shows, as an example and without limitation, implementing a programmable resistance circuit 300 that can provide a selected, effective resistance between source 350 and return 340 relative to a voltage divider 351 formed between the source resistor 365 (i.e., the comparator resistor) from the perspective of a remote module utilizing the selected resistance for additional computing purposes. As noted above, the effective resistance sensed by an external electronic control module triggers certain functions that a user has selected with a button zone. Overall, the effective resistance is "selected" by configuring a first resistor, referred to herein as a reference resistor 330, to exhibit an effective resistance in an operational sense. The effective resistance is achieved with an average output voltage between a source line 350 and an analog return line 340 in the programmable resistance circuit, with the average output voltage corresponding to the effective resistance. In other words, when many designers look to a use a particular resistance to provide a voltage across a particular input circuit, this disclosure allows one to configure an average voltage that reflects an effective resistance of the reference resistor 330, and, due to voltage drops, the programmable resistance circuit 300 "looks like" a particularly selected resistance to a remote but connected electronic module that is external to the particular input circuit, i.e., external to a programmable resistance circuit 300.

The effective resistance is, furthermore, achieved by utilizing a modulated voltage source 310, such as a pulse width modulator or pulse density modulator, to intermittently draw current across the reference resistor 330 according to the duty cycle of the modulated voltage source 310. By configuring a modulated voltage source 310 with a selected duty cycle, a programmed resistance circuit 300 can look like a selected resistance when connected to a remote circuit that acts according to that selected resistance. One non-limiting application for this kind of tailored resistance or impedance would be useful in assigning different selected resistances generated by the programmable resistance circuit 300 to respective button selection zones of a vehicle user interface.

As noted above, vehicle user interfaces allow a user to select vehicle functionality by touching or otherwise activating a selection zone in a touch screen or other interactive user human-machine interface. In one non-limiting example, when a button selection zone is activated, that activation can prompt a microcontroller 200 to set a respective duty cycle to a modulated voltage source 310 connected to the programmable resistance circuit 300. The duty cycle will ultimately help set the voltage drop between a source line 350 and an analog return line 340 of the programmable resistance circuit 300, and that voltage drop is a result of the effective resistance that the reference resistor 330 can provide in the presence of the modulated voltage source 310. In this way, each button selection zone requires a unique duty cycle for the modulate voltage source 310 and results in a uniquely selected resistance sensed by a remote module (i.e., an "external electronic control module") interacting with the programmable resistance circuit 300, such as the connection 370 available to a remote analog to digital controller (ADC), for example. This circuit can use a plurality of different duty cycles assigned to the same number of button selection zones, and a user's selection is accurately sensed by a microcontroller 200 because the local ground 315 of the programmable resistance circuit 300 and the remote ground 385 of the microcontroller 200 are isolated from each other by the selected resistance (or impedance) provided by the programmed resistance circuit.

One non-limiting general description is that by switching the reference resistor 330 on and off using a modulated voltage source 310, an average effective resistance is achieved. In this sense, the effective resistance provided by the reference resistor 330 is equal to the reference resistor value divided by the duty cycle. The example implementations below emphasize this operation.

In one implementation, a programmable resistance circuit 300 configures a reference resistor 330 to exhibit a plurality of resistance values and provide a respectively selected resistance value from a source line connection 350 relative to a return circuit connecting a return signal to at least one external electronic control module (e.g., an external electronic control module optionally connected to the node at connection 370). The programmable resistance circuit 300 includes a transistor 325 configured for connecting to the reference resistor 330. One should note that the reference resistor 330 may be part of any remote circuit and not necessarily limited to being a part of the programmable resistance circuit (e.g., the reference resistor of a reading circuit 200 connected to the resistive ladder 100 of FIG. 1). In this sense, an effective resistance may be calculated by considering more than one particular input circuit to a corresponding external electronic control module. The transistor 325 is connected to an analog return line 340 from the programmable resistance circuit 300, which in turn is connected to a remote ground 385 to eliminate voltage offsets at local 315 and remote 385 grounds. A modulated voltage source 310 is connected to a local ground 315 and the transistor 325, wherein the modulated voltage source 310 biases the transistor 325 between a first state, allowing forward current flow in the programmable resistance circuit 300 from the source line 350 to the analog return line 340, and a second state exhibiting a high impedance to the forward current flow to the analog return line 340. In one implementation, forward current flow originates from an external voltage source 375 that establishes an external voltage value 360 relative to a remote ground 385 or any connected respective ground other than the local ground 315. The transistor 325 is controlled by the duty cycle of the modulated voltage source 310 that is, in turn, set for a given selected button zone. Forward current flow on the analog return line 340 exhibits characteristics of an effective resistance, over time, of the reference resistor 330 as established with corresponding forward flow across the primary filter elements 335, 337, 355 when the transistor is in a high impedance state according to the duty cycle.

A first state and a second state of the transistor 325 respectively emulate turning the reference resistor 330 off and on to establish an average or selected resistance value sensed at a remote module, such as but not limited to, the reading module of a microcontroller 200 connected to a sensor system such as but not limited to a resistive ladder 100. The average selected resistance value is the result of establishing an average output voltage from the source line 350 to the analog return line 340 in the programmable resistance circuit 300. The analog return line 340 ultimately connects to a remote ground 385 of at least one external electronic circuit module such that the analog return line 340 is isolated from the local ground 315 of the programmable resistance circuit 300. The modulated voltage source 310 may be a pulse width modulation (PWM) voltage source, a pulse density modulated voltage source, or the like, and configured with a selected duty cycle. A secondary filter 320 further ensures the isolation. The duty cycle establishes the respectively selected resistance value between the source line 350 and the analog return line 340 connected to the programmable resistance circuit 300, and the selected resistance is reflected to an external circuit (i.e., an external electronic control module) interacting with the programmable resistance circuit 300. In other words, the selected effective resistance between the source line 350 and the analog return line 340 corresponds to the output voltage between the source line and the analog return line. A primary filter circuit 335, 337, 355 connects the reference resistor 330 and the analog return line 340 to establish a smooth average voltage between the source line, or source connection, 350 and the return line 340. A secondary filter circuit 320 isolates the return line 340 from the local ground 315.

The modulated voltage source 310 is provided by or has a connection to a microcontroller 200 and is configured to receive a plurality of different duty cycle settings. Each duty cycle setting corresponds to a distinct button zone processed by the microcontroller. In the example of FIG. 3, an average output voltage is formed between the source line 350 and the analog return line 340 via the programmable resistance circuit 300 by a reading module source supply (i.e., external voltage source 375), the reference resistor 330, and the analog return line 340 which in one non-limiting example are configured to connect to an analog to digital controller (ADC) for further digital control processing.

Implementations of the disclosure, therefore, include a programmable resistance circuit 300 for configuring a reference resistor 330 to exhibit a plurality of resistance values and providing a respective resistance value from a source connection 350 relative to a return circuit 340 connecting a return signal to at least one external electronic control module (not shown, but including vehicle control systems, vehicle control computers, and the like). The programmable resistance circuit 300 may incorporate a transistor 325 configured for connecting to the reference resistor 330, the transistor being connected to an analog return line 340 from the programmable resistance circuit 300. A modulated voltage source 310 connects to a local ground 315 and the transistor 325, wherein the modulated voltage source 310 biases the transistor 325 between a first state allowing forward current flow to the analog return line 340 and a second state exhibiting a high impedance to the forward current flow to the analog return line 340. The first state and the second state respectively emulate turning the reference resistor 330 off and on to establish the average respective resistance value to the at least one external electronic control module and to establish an average output voltage across the programmable resistance circuit 300. The analog return line 340 connects to a remote ground 385, which may optionally be the same or connected to a respective ground (not shown) of the at least one external electronic circuit module such that the analog return line 340 is isolated from the local ground 315 of the programmable resistance circuit 300. Isolating the local ground 315 of the programmable resistance circuit 300 ensures that the programmable resistance circuit provides a plurality of discrete, previously set values of an effective resistance across the reference resistor 300, as reflected to the at least one external electronic control module. The local ground 315 is connected to the modulated voltage source 310 and a secondary filter 320 further isolating the analog return line from the local ground. The modulated voltage source 310 may be implemented as a pulse width modulation (PWM) voltage source configured with a selected duty cycle, and the duty cycle establishes the respective effective resistance value between the source connection and the analog return line. A microcontroller 200 connected to the at least one external electronic control module sets the duty cycle. One way to describe the effective resistance of the programmable resistance circuit 300 is by considering the effective resistance to be a "reflected resistance" between the source line 350 and the analog return line 340. The effective resistance corresponds to the output voltage across the programmable resistance circuit 300 and further corresponds to a button zone selection directed to the at least one external electronic circuit module that may be connected, for example, to output node 370 and the remote ground 385. As described above, the duty cycle further establishes the reflected resistance, or "effective resistance" sensed between the output node 370 and the remote ground 385. The above described primary filter circuit of elements 335, 337, 355 (or the like) connect the reference resistor 330 and the analog return line 340 for smoothing the output at the output node 370 and for periods when the effective resistance of the reference resistor 330 is extremely high. It follows, therefore, that the modulated voltage source 310 may include a connection to a microcontroller 200 and is configured to receive a plurality of different duty cycle settings from the microcontroller. Each duty cycle setting corresponds to a distinct button zone processed by the microcontroller. The average output voltage at output node 370 is formed across the programmable resistance circuit 300 by a external voltage source supply 375 and the reference resistor 330 and the analog return line 340 which are configured to connect to an analog to digital controller (ADC) for use in digital control systems in a vehicle.

In another embodiment, a computerized system for processing switch data in a vehicle includes a user interface in a vehicle configured for a user to operate vehicle button selection zones. A microcontroller 200 processes user inputs received at the vehicle button selection zones and implements the systems and methods of this disclosure. A modulated voltage source 310 is controlled by the microcontroller 200, wherein the microcontroller adjusts a modulated voltage output according to the user inputs received at the vehicle button selection zones. The modulated voltage output is a controlling component for a programmable resistance circuit 300 providing a respective effective resistance value from a source connection 350 relative to an analog return line 340 connecting a return signal to the at least one external electronic control module. As described above, a local ground 315 is connected to the modulated voltage source 310 and a remote ground 385 is connected to the analog return line 340 for connect to the external electronic control module.

The computerized system of the embodiments utilizes an external voltage source connected to the at least one external electronic circuit module and the programmable resistance circuit 300. A reference resistor 330 is connected to the external voltage source 375 with a comparison resistor 365, the reference resistor 330 setting a current amplitude drawn from the voltage source 375 to the programmable resistance circuit 300. A transistor 325 is connected to the reference resistor 330 and connected to the analog return line 340 that is ultimately connected to the microcontroller 200, either directly or through an external electronic control module. A modulated voltage source 310 biases the transistor 325 between a first state allowing forward current flow to the analog return line 340 and a second state exhibiting a high impedance to the forward current flow, wherein the first state and the second state respectively emulate turning the reference resistor 330 off and on, and wherein the second state, with the reference resistor 330 effectively off, establishes an average output resistance from the programmable resistance circuit.

As set forth above in other embodiments, multiple external electronic control modules in a vehicle will have a respective ground and in optional embodiments, may further connect to the remote ground 385 and the analog return line 340. The modulated voltage source 310 may utilize a pulse width modulation (PWM) voltage source configured with a selected duty cycle, and wherein the duty cycle establishes the average output resistance from the programmable resistance circuit 300. An average output voltage across the programmable resistance circuit 300 corresponds to a function selection as read by the external electronic control module, including but not limited to a remote module's analog to digital converter that is part of an overall digital control system. By establishing the impedance of the transistor 325, the duty cycle associated with a user selection further establishes a source voltage on an analog source line 350 in conjunction with the external voltage source 375 and a comparison resistor 365. A primary filter circuit, such as but not limited to a first capacitor 335, a resistor 337, and a second capacitor 355, connects to the reference resistor 330, the analog source line 350, and the analog return line 340 for smoothing operations. The modulated voltage source 310 is adjustable according to a plurality of different duty cycle settings. Each duty cycle setting corresponds to a distinct function selection of the user interface processed by the microcontroller 200. In some non-limiting implementations, the modulated voltage source 310 is a pulse width density modulated voltage source.

Any combination of one or more computer readable media may be utilized to use the circuit described herein. A computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular implementations only and is not intended to be limiting of the disclosure. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The implementations were chosen and described in order to best explain the principles of the disclosure and the practical application, and to enable others of ordinary skill in the art to understand the disclosure for various implementations with various modifications as are suited to the particular use contemplated.

The invention claimed is:

1. A programmable resistance circuit for configuring a plurality of output voltages with a reference resistor, the programmable resistance circuit comprising:
   a transistor connected to the reference resistor and an analog return line from the programmable resistance circuit;
   a modulated voltage source connected to the transistor, wherein the modulated voltage source biases the transistor between a first state allowing forward current flow to the analog return line and a second state exhibiting a high impedance to the forward current flow to the analog return line,
   wherein the first state and the second state respectively emulate turning the reference resistor off and on to establish an average output voltage across the programmable resistance circuit, wherein the average output voltage corresponds to an average resistance value of the reference resistor.

2. The programmable resistance circuit of claim 1, wherein the analog return line connects to a remote ground of at least one external electronic circuit module, and wherein the analog return line is isolated from the local ground of the programmable resistance circuit.

3. The programmable resistance circuit of claim 2, wherein the average output voltage across the programmable resistance circuit drives the at least one external electronic control module.

4. The programmable resistance circuit of claim 2, wherein the local ground is connected to the modulated voltage source and a filter connected to the analog return line, wherein the filter comprises resistance that isolates the local ground of the programmable resistance circuit.

5. The programmable resistance circuit of claim 2, wherein the modulated voltage source comprises a pulse width modulation (PWM) voltage source configured with a selected duty cycle, and wherein the duty cycle establishes the average resistance value between a source line of the at least one external electronic circuit module and the analog return line.

6. The programmable resistance circuit of claim 5, wherein a microcontroller connected to the modulated voltage source sets the selected duty cycle.

7. The programmable resistance circuit of claim 6, wherein a reflected resistance between the source line and the analog return line corresponds to the average output voltage across the programmable resistance circuit and further corresponds to a button zone selection directed to the at least one external electronic circuit module.

8. The programmable resistance circuit of claim 7, wherein the duty cycle further establishes the reflected resistance.

9. The programmable resistance circuit of claim 8, further comprising a primary filter circuit connecting the reference resistor and the analog return line.

10. The programmable resistance circuit of claim 1, wherein the modulated voltage source comprises a connection to a microcontroller and is configured to receive a plurality of different duty cycle settings.

11. The programmable resistance circuit of claim 10, wherein each duty cycle setting corresponds to a distinct button zone processed by the microcontroller.

12. The programmable resistance circuit of claim 10, wherein the average output voltage is formed across the programmable resistance circuit by a reading module source supply and the reference resistor and the analog return line, which are configured to connect to an analog to digital controller (ADC).

13. A computerized system for processing switch data with an external electronic control module in a vehicle, the system comprising:
a user interface in a vehicle configured for a user to operate vehicle button selection zones;
a microcontroller processing user inputs received at the vehicle button selection zones;
a modulated voltage source in communication with the microcontroller, wherein the microcontroller adjusts a duty cycle of a modulated voltage output from the modulated voltage source according to the user inputs received at the vehicle button selection zones;
a programmable resistance circuit comprising a reference resistor receiving the modulated voltage output with the duty cycle; and
an average output voltage provided from the programmable resistance circuit to the external electronic control module, wherein the average output voltage corresponds to an average resistance value of the reference resistor corresponding to the duty cycle of the modulated voltage source.

14. The computerized system of claim 13, further comprising:
an external voltage source connected to the external electronic circuit module and the programmable resistance circuit;
a comparison resistor connecting the external voltage source to the reference resistor, the reference resistor setting a current amplitude drawn from the external voltage source across the programmable resistance circuit to the external electronic module;
a transistor connected to the reference resistor and connected to an analog return line that is further connected to the microcontroller,
a modulated voltage source biasing the transistor between a first state allowing forward current flow to the analog return line and a second state exhibiting a high impedance to the forward current flow,
wherein the first state and the second state respectively emulate turning the reference resistor off and on to establish the average output voltage according to the duty cycle of the modulated voltage source.

15. The programmable resistance circuit of claim 14, further comprising a remote ground connected to the external electronic circuit module and a local ground connected to the transistor, further comprising a filter connected to the analog return line and isolating the local ground from the remote ground.

16. The computerized system of claim 13, wherein the modulated voltage source comprises a pulse width modulation (PWM) voltage source configured with a selected duty cycle, and wherein the selected duty cycle establishes the average output resistance from the programmable resistance circuit.

17. The computerized system of claim 16, wherein the average output voltage across the programmable resistance circuit corresponds to a vehicle function selection as read by the external electronic module.

18. The computerized system of claim 13, wherein the modulated voltage source is adjustable according to a plurality of different duty cycle settings.

19. The computerized system of claim 18, wherein each duty cycle setting corresponds to a distinct function selection of the user interface processed by the microcontroller.

20. The computerized system of claim 13, wherein the modulated voltage source is a pulse width density modulated voltage source.

* * * * *